United States Patent
Kim et al.

(10) Patent No.: US 7,810,232 B2
(45) Date of Patent: Oct. 12, 2010

(54) METHOD OF MANUFACTURING A CIRCUIT BOARD

(75) Inventors: Keun-Ho Kim, Daejeon (KR); Dek-Gin Yang, Chungcheongbuk-do (KR); Jong-Guk Kim, Daejeon (KR); Il-Kyoon Jeon, Paju-si (KR); Eung-Suek Lee, Ansan-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 238 days.

(21) Appl. No.: 11/976,617

(22) Filed: Oct. 25, 2007

(65) Prior Publication Data

US 2008/0052902 A1 Mar. 6, 2008

Related U.S. Application Data

(62) Division of application No. 11/645,710, filed on Dec. 27, 2006, now Pat. No. 7,473,099.

(30) Foreign Application Priority Data

Jul. 6, 2006 (KR) .................. 10-2006-0063634

(51) Int. Cl.
*H05K 3/36* (2006.01)
(52) U.S. Cl. .............. 29/830; 29/825; 29/832; 29/840; 29/846
(58) Field of Classification Search .......... 29/825, 29/830, 832, 840, 846
See application file for complete search history.

(56) References Cited

U.S. PATENT DOCUMENTS

| | | | | |
|---|---|---|---|---|
| 4,938,280 A | * | 7/1990 | Clark | .............. 165/80.4 |
| 5,239,746 A | * | 8/1993 | Goldman | ................. 29/840 |
| 5,306,670 A | * | 4/1994 | Mowatt et al. | ............... 29/832 |
| 6,032,355 A | * | 3/2000 | Tseng et al. | ................ 29/840 |
| 6,163,957 A | * | 12/2000 | Jiang et al. | ................ 29/852 |
| 6,265,772 B1 | | 7/2001 | Yoshida | |
| 6,326,555 B1 | * | 12/2001 | McCormack et al. | ....... 174/255 |
| 6,442,043 B1 | | 8/2002 | Seki | |
| 6,739,048 B2 | | 5/2004 | Jones | |
| 6,820,328 B2 | * | 11/2004 | Barcley | .................. 29/832 |

(Continued)

FOREIGN PATENT DOCUMENTS

JP  7-86711  3/1995

(Continued)

OTHER PUBLICATIONS

U.S. Appl. No. 11/645,710, filed Dec. 27, 2006, Keun-Ho Kim et al, Samsung Electromechanics Co., LTD.

(Continued)

*Primary Examiner*—C. J Arbes

(57) ABSTRACT

A printed circuit board and manufacturing method thereof. A printed circuit board has an insulation substrate, which includes an insulation layer, a circuit pattern formed on one side of the insulation layer, and an interlayer passage joined to the insulation layer and configured to electrically connect with the circuit pattern, and a heat-release layer, which is stacked on the other side of the insulation layer to be stacked on the insulation substrate, can provide a high heat-releasing effect and high bending strength, by means of inner layers or ground layers formed by the heat-release layers.

4 Claims, 5 Drawing Sheets

U.S. PATENT DOCUMENTS

| | | | |
|---|---|---|---|
| 6,826,830 B2 * | 12/2004 | Egitto et al. | 29/852 |
| 6,828,510 B1 | 12/2004 | Asai | |
| 6,924,987 B2 | 8/2005 | Sugimoto | |
| 7,279,412 B2 * | 10/2007 | Mok et al. | 438/622 |
| 7,328,505 B2 * | 2/2008 | Kondo | 29/846 |
| 2005/0016764 A1 * | 1/2005 | Echigo et al. | 174/256 |
| 2008/0052902 A1 * | 3/2008 | Kim et al. | 29/829 |
| 2009/0064497 A1 * | 3/2009 | Mok et al. | 29/846 |

FOREIGN PATENT DOCUMENTS

| | | |
|---|---|---|
| JP | 2001-94255 | 4/2001 |
| JP | 2001-168228 | 6/2001 |
| KR | 10-2001-076475 | 8/2001 |
| KR | 10-2001-0076475 | 8/2001 |

OTHER PUBLICATIONS

Japanese Patent Office Action, mailed Aug. 26, 2008 and issued in corresponding Japanese Patent Application No. 2006-347570.

U.S. Patent Office Action, Sep. 10, 2007, issued in corresponding U.S. Appl. No. 11/645,710.

U.S. Patent Office Action, Jan. 2, 2008, issued in corresponding U.S. Appl. No. 11/645,710.

U.S. Patent Office Action, May 13, 2008, issued in corresponding U.S. Appl. No. 11/645,710.

U.S. Patent Office Notice of Allowance, Oct. 2, 2008, issued in corresponding U.S. Appl. No. 11/645,710.

U.S. Patent Office Supplemental Notice of Allowance, Nov. 19, 2008, issued in corresponding U.S. Appl. No. 11/645,710.

* cited by examiner

METHOD OF MANUFACTURING A CIRCUIT BOARD

CROSS-REFERENCE TO RELATED APPLICATIONS

This application is a divisional of U.S. patent application Ser. No. 11/645,710, filed Dec. 27, 2006, now U.S. Pat. No. 7,473,099 which application is based upon and claims the priority of Korean Patent Application No. 2006-0063634 filed with the Korean Intellectual Property Office on Jul. 6, 2006, the disclosures of which are incorporated herein by reference in their entirety.

BACKGROUND OF THE INVENTION

1. Technical Field

The present invention relates to a printed circuit board and a manufacturing method thereof.

2. Description of the Related Art

As electronic products are currently becoming slimmer and given more functionalities, the printed circuit board (PCB) is being mounted with a greater number of passive elements and higher-density, multilayer packages, the trend of which will continue in the future. The printed circuit board basically served to connect various electronic components according to the circuit design of electrical wiring, or to support the components, on a printed circuit substrate. However, with the greater number of passive components or packages mounted, there is more electrical consumption and greater amounts of heat generated in the components. This becomes an important criterion in the reliability of the product as well as in user preferences for the product. Thus, there is a demand for a functional printed circuit board capable of effectively releasing and emitting heat generated due to high levels of functionality.

SUMMARY OF THE INVENTION

Certain aspects of the present invention aim to provide a printed circuit board and a manufacturing method thereof, in which a heat-release layer is selectively inserted within the printed circuit board to provide a high heat-releasing effect and high bending strength.

One aspect of the invention may provide a printed circuit board composed of an insulation substrate, which includes an insulation layer, a circuit pattern formed on one side of the insulation layer, and an interlayer passage joined to the insulation layer and configured to electrically connect with the circuit pattern, and a heat-release layer, which is stacked on the other side of the insulation layer to be stacked on the insulation substrate.

Multiple insulation substrates may be formed, where each of the insulation layers may be stacked in order, with the heat-release layer stacked in-between the insulation substrates.

The heat-release layer may be made of a material including aluminum, the interlayer passage may be a paste bump joined to the circuit pattern and hardened, and the insulation layer may be formed to have a thickness that is in correspondence with the thickness of the heat-release layer.

The interlayer passage may be formed of a through-hole penetrating the insulation layer and conductive paste filled in the through-hole.

Another aspect of the invention may provide a method of manufacturing a printed circuit board, including (a) forming a circuit pattern on one side of an insulation layer, (b) forming an insulation substrate by penetrating the insulation layer and forming an interlayer passage which electrically connects with the circuit pattern, and (c) stacking a heat-release layer on the insulation substrate by stacking a heat-releasing layer on the other side of the insulation layer.

The method may further include, after the operation (c) of stacking a heat-release layer on the insulation substrate, (d) forming a plurality of insulation substrates by repeating the operation (a) of forming a circuit pattern and the operation (b) of forming an insulation substrate, and (e) stacking the plurality of insulation substrates in order.

In performing the operation (e) of stacking the plurality of insulation substrates in order, an operation (f), of additionally interposing heat-release layers in-between the plurality of insulation layers, may be performed in parallel.

Meanwhile, the operation (a) of forming a circuit pattern and the operation (b) of forming an insulation substrate may be performed by (a1) joining and hardening a paste bump onto a metal layer, (a2) stacking the insulation layer on the metal layer such that the paste bump penetrates the insulation layer, and (a3) removing portions of the metal layer to form the circuit pattern and the interlayer passage.

Moreover, the operation (b) of forming an insulation substrate may be performed by (b1) perforating a through-hole, which penetrates the insulation layer, in correspondence with a position of the circuit pattern, and (b2) filling the through-hole with conductive paste to form the interlayer passage.

Additional aspects and advantages of the present invention will become apparent and more readily appreciated from the following description, including the appended drawings and claims, or may be learned by practice of the invention.

DETAILED DESCRIPTION OF THE PREFERRED EMBODIMENTS

Embodiments of the invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
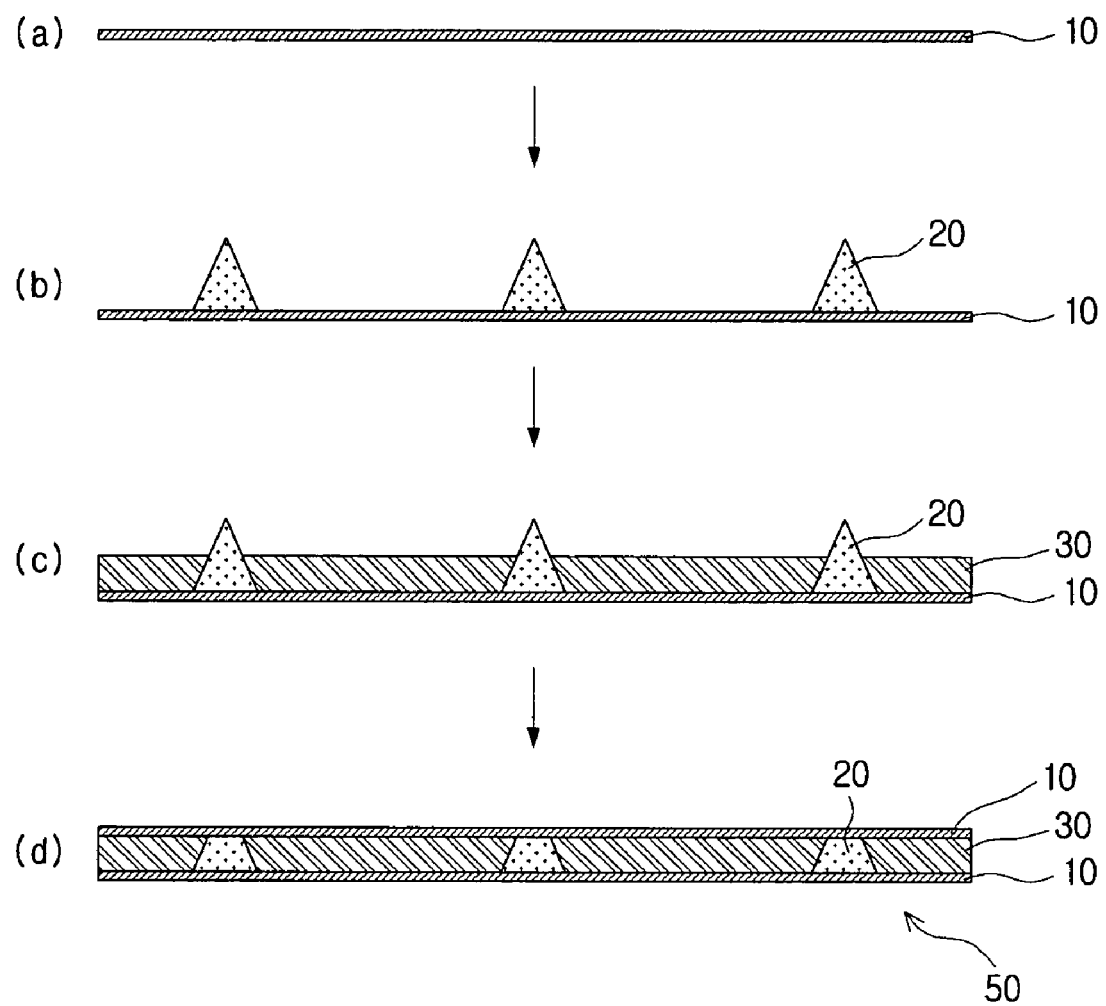
FIG. 1 is a series of cross-sectional views illustrating a process of forming interlayer passages for a printed circuit board based on a first disclosed embodiment of the invention.
Figure 2:
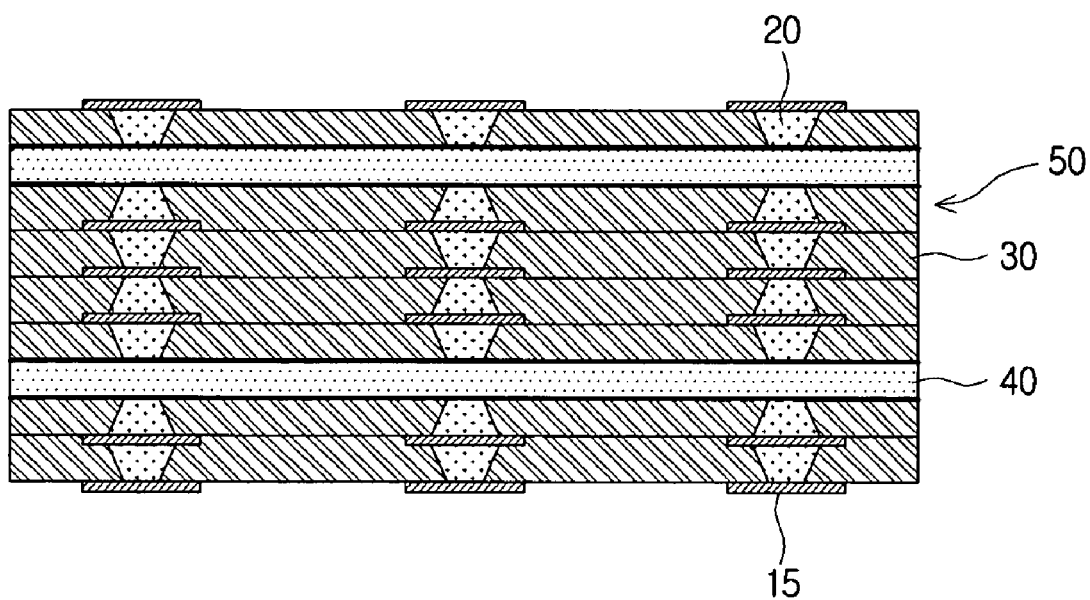
FIG. 2 is a cross-sectional view illustrating the composition of a printed circuit board based on a first disclosed embodiment of the invention.

FIG. 1 is a series of cross-sectional views illustrating a process of forming interlayer passages for a printed circuit board based on a first disclosed embodiment of the invention, and FIG. 2 is a cross-sectional view illustrating the composition of a printed circuit board based on a first disclosed embodiment of the invention. In FIGS. 1 and 2 are illustrated copper sheets 10, circuit patterns 15, paste bumps 20, insulation layers 30, heat-release layers 40, and an insulation substrate 50.

In this embodiment, heat-release layers 40 are selectively inserted in-between layers, in a printed circuit board formed by stacking a plurality of insulation substrates 50, to provide a high heat-releasing effect and high bending strength.

The insulation substrate 50 is a unit component forming a multilayer printed circuit board, and may be composed of copper sheets 10, circuit patterns 15, paste bumps 20, and insulation layers 30, each of which will be described below.

The copper sheet 10 allows the forming of a circuit pattern 15 by etching, etc. It is stacked on the insulation layer 30, and may have paste bumps 20 formed on one side.

The circuit pattern 15 allows a printed circuit board based on this embodiment to perform its function according to its design, and may be formed by performing etching on the copper sheet 10.

While this embodiment presents the case of forming a circuit pattern 15 by stacking a copper sheet 10 on an insulation layer 30 and performing etching, it is apparent that the method of forming the circuit pattern may vary according to design requirements.

The paste bumps 20 may be formed on one side of the copper sheet 10, and may function as interlayer passages when they penetrate the insulation layer 30. Since the paste bumps 20 may transfer electrical signals between layers, they may be electrically connected with the circuit pattern 15 formed adjacent to one side of the insulation layer 30, and may be made of a conductive material, such as copper (Cu), silver (Ag), or aluminum (Al), etc.

The paste bumps 20 may be formed on one side of the copper sheet 10 by a screenprinting technique, but it is apparent that they may be formed using any of a variety of methods.

The insulation layer 30 is a means for blocking electrical signals through routes other than the circuit pattern 15 or the interlayer passages, as well as for attaching copper sheets 10, and may be made of a polymer composition such as Prepreg (FR-4 epoxy resin) or electrically conductive adhesive, etc.

As the insulation layer 30 is stacked on one side of the copper sheet 10, on which the paste bumps 20 are formed, the paste bumps 20 penetrate the insulation layer 30, whereby interlayer passages may be formed.

Here, another copper sheet 10 may again be stacked, with paste bumps 20 and insulation layers 30 stacked repeatedly as described above, to result in the manufacture of a multilayer printed circuit board.

Here, a heat-release layer 40 may selectively be inserted between each layer, and the composition of a printed circuit board having heat-release layers 40 selectively inserted is shown in FIG. 2.

In FIG. 2 is illustrated a printed circuit board composed of a plurality of insulation layers 30, each having a circuit pattern 15 and paste bumps 20 formed thereon, and heat-release layers 40 stacked together.

The heat-release layer 40 may be made of aluminum. While aluminum has a lower thermal conductivity than does gold, silver, or copper, etc., the difference is not significant, and as it can be obtained at a low cost, it may be the most advantageous material for use in the heat-release layer 40 inserted in a printed circuit board. The characteristics of the material also allow easier handling.

By thus inserting heat-release layers 40, the heat generated in portions of high-density mounting can be distributed to other portions, so that the temperature of the overall printed circuit board can be reduced. Also, because of the properties of the metal material, an additional effect of increased bending strength is obtained.

Meanwhile, in order to resolve the problem of increased volume of the printed circuit board caused by inserting the heat-release layers 40, the thicknesses of the insulation layers 30 may be decreased in correspondence with the thicknesses of the heat-release layers 40.

Figure 3:
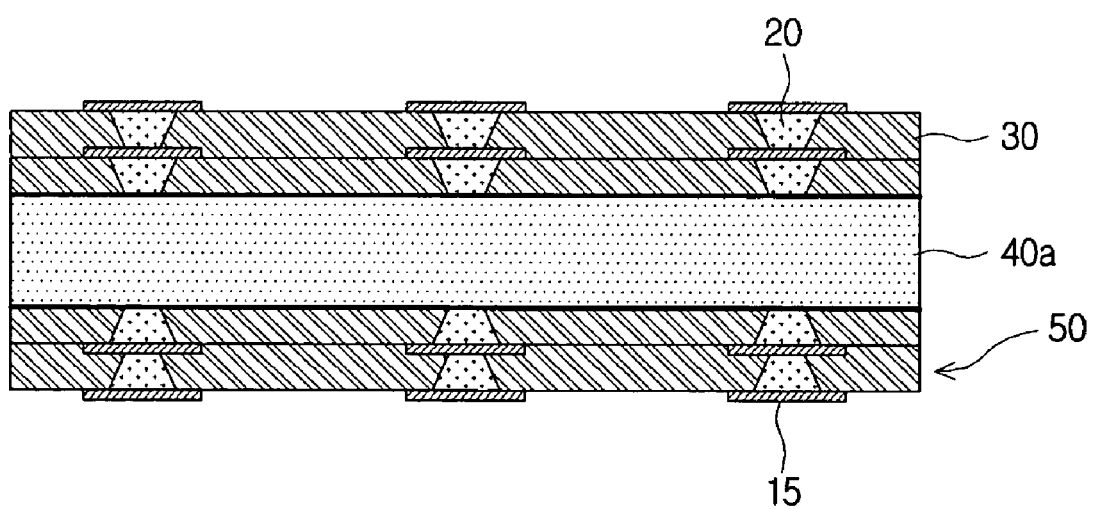
FIG. 3 is a cross-sectional view illustrating the composition of a printed circuit board based on a second disclosed embodiment of the invention.

FIG. 3 is a cross-sectional view illustrating the composition of a printed circuit board based on a second disclosed embodiment of the invention. Referring to FIG. 3, a printed circuit board may be presented which has insulation layers 30, each of which has a circuit pattern 15 and paste bumps 20 formed thereon, stacked on a core of a thick heat-release layer 40a.

Unlike the first disclosed embodiment of the invention, this embodiment has only one heat-release layer 40a, which has a large thickness, inserted in the center portion of the multilayer printed circuit board. This allows for a sufficient heat releasing effect, while at the same time providing an effect of simplified manufacture process by allowing collective stacking.

Figure 4:
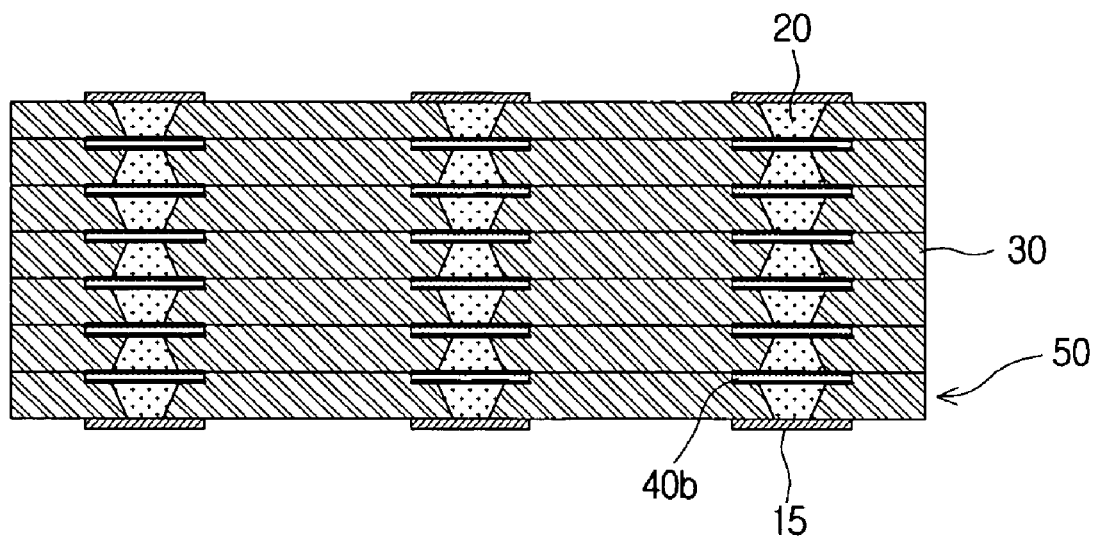
FIG. 4 is a cross-sectional view illustrating the composition of a printed circuit board based on a third disclosed embodiment of the invention.

FIG. 4 is a cross-sectional view illustrating the composition of a printed circuit board based on a third disclosed embodiment of the invention. Referring to FIG. 4, a printed circuit board may be presented which has the paste bumps 20 and circuit patterns 15 formed on heat-release substrates.

In this embodiment, unlike the first and second embodiments described above, in which heat-release layers 40, 40a are inserted that are separate from the circuit patterns 15, the paste bumps 20 and circuit patterns 15 are formed on the heat-release layers 40b, so that the transfer of heat is achieved in a more direct manner. This allows a faster and smoother heat transfer, to provide the effect of efficiently decreasing the temperature of the overall printed circuit board.

Figure 5:
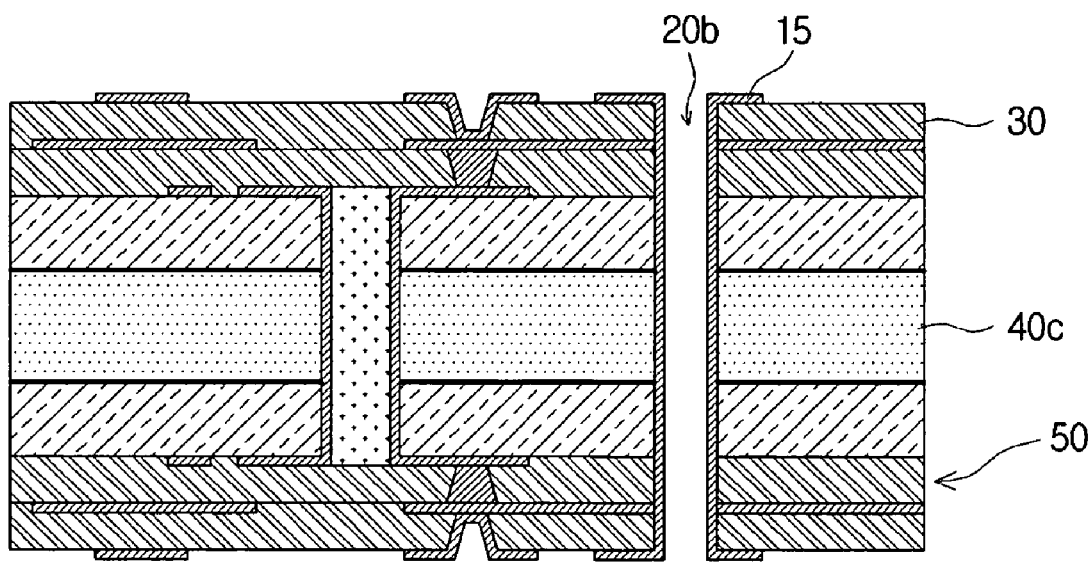
FIG. 5 is a cross-sectional view illustrating the composition of a printed circuit board based on a fourth disclosed embodiment of the invention.

FIG. 5 is a cross-sectional view illustrating the composition of a printed circuit board based on a fourth disclosed embodiment of the invention. Referring to FIG. 5, a printed circuit board may be presented which has insulation layers 30, which have circuit patterns 15 and through-holes 20b formed thereon, stacked on a core of a thick heat-release layer 40c.

Except for the interlayer passages, the structure of a printed circuit board based on this embodiment is identical or similar to the structure of a printed circuit board based on the second disclosed embodiment of the invention. Thus, detailed descriptions on the structure will not be provided other than for the interlayer passages.

In a printed circuit board based on this embodiment, through-holes 20b penetrating the insulation layers 30, and plating layers formed on the wall surfaces of the through-holes 20b may be formed as interlayer passages.

While the through-holes 20b may be formed by drilling, it is apparent that they may be formed by any of a variety of methods, such as by laser etching, etc., according to design requirements.

Afterwards, the interlayer passages may be formed by performing copper plating on the wall surfaces of the through-holes 20b to form plating layers, and then electrically connecting the plating layers with the circuit patterns 15.

When forming a through-hole 20b in the insulation layer 30 by drilling, the insulation layer 30 may in some cases melt, due to the drill bit rotating at a high speed, and be attached to the inner wall of the through-hole 20b. This is referred to as a smear, and should desirably be removed, as it has a devastating effect on the quality of the plating layer. A procedure for removing a smear is referred to as desmearing.

Figure 6:
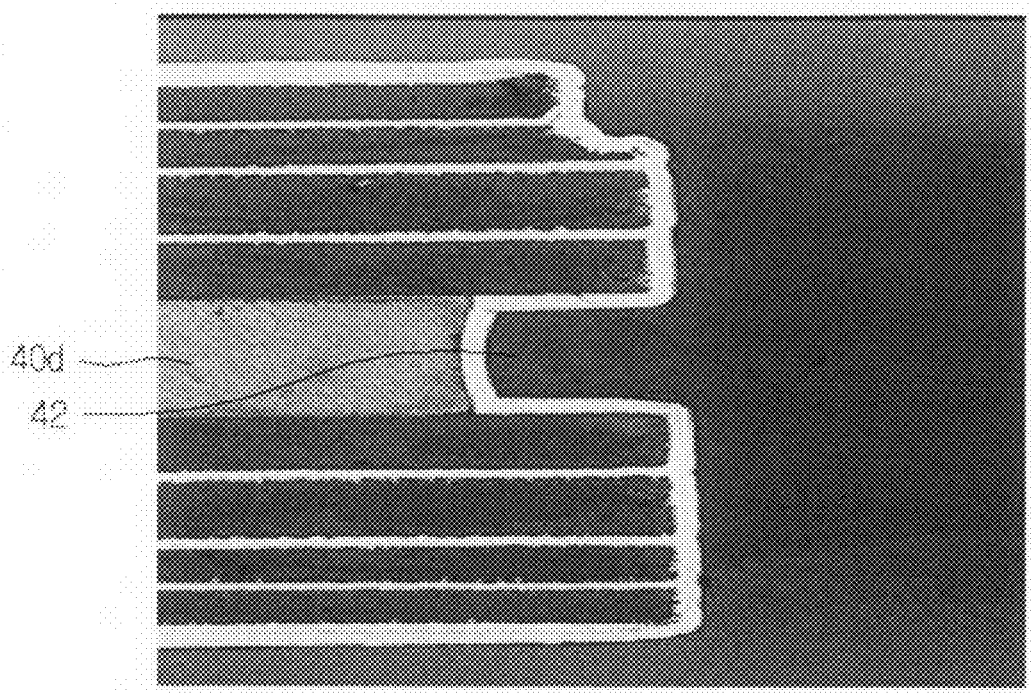
FIG. 6 is a photograph of a subsided portion in a printed circuit based on the fourth disclosed embodiment of the invention.

In the process of performing desmearing using a chemical method, a portion of the heat-release layer 40d may melt and become subsided, as can be seen in FIG. 6.

When a subsided portion 42 has been formed, as shown in FIG. 6, problems may occur in forming plating layers on the wall surfaces of the through-holes 20b, such as that the heat-release layer 40d, which performs the function of grounding, and the plating layers cannot be electrically connected with each other, i.e. the ground and the circuit patterns 15 cannot be electrically connected.

Figure 7:
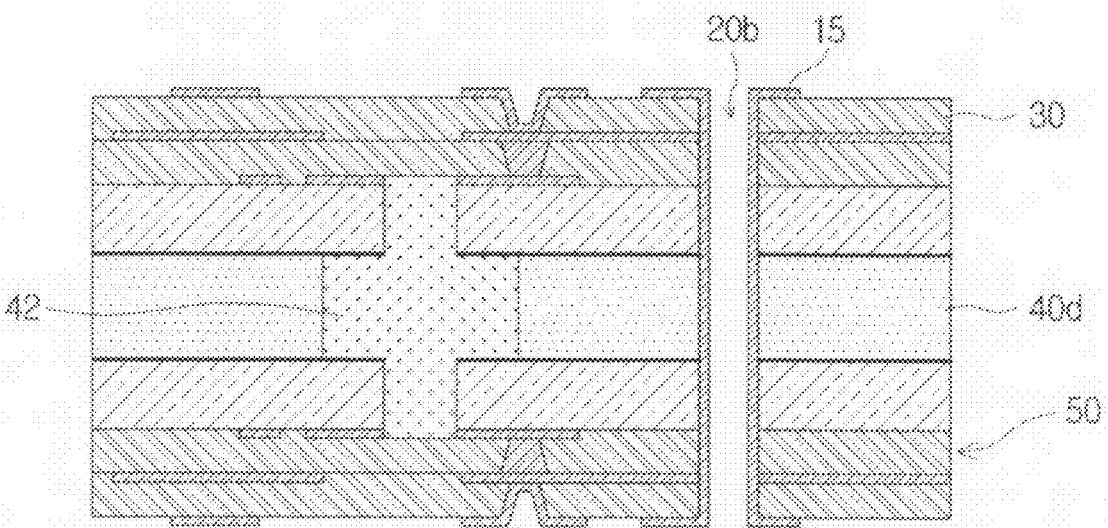
FIG. 7 is a cross-sectional view illustrating the composition of a printed circuit board based on a fifth disclosed embodiment of the invention.

Thus, in such cases, the through-holes 20b may be filled with conductive paste, as illustrated in FIG. 7, such that the conductive paste reaches the subsided portions 42, whereby the ground and the circuit patterns 15 may be electrically connected. The printed circuit board of the composition shown in FIG. 7 is a printed circuit board based on a fifth disclosed embodiment of the invention.

Figure 8:
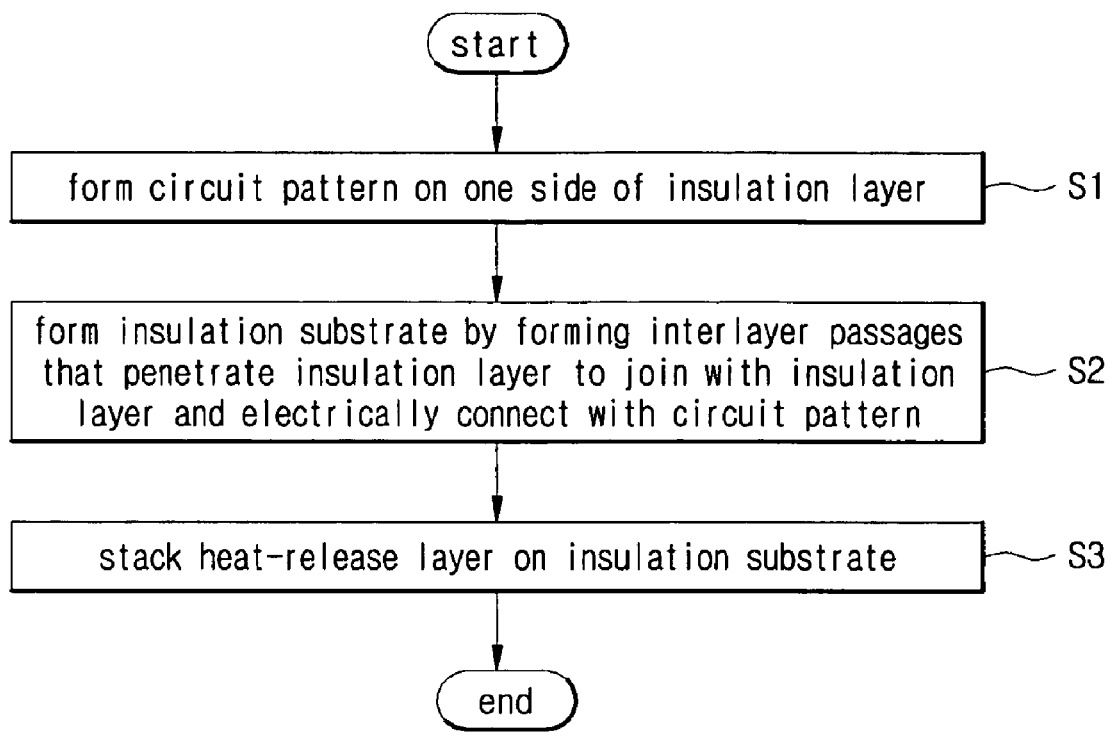
FIG. 8 is a flowchart illustrating a method of manufacturing a printed circuit board based on an embodiment of the invention.

Next, a manufacturing method of a printed circuit board, according to another aspect of the invention will be described with reference to FIG. 8. FIG. 8 is a flowchart illustrating a method of manufacturing a printed circuit board based on an embodiment of the invention.

Operation s1 is of forming a circuit pattern 15 on the surface of an insulation layer 30, and is for forming the circuit patterns intended by the designer.

The circuit pattern 15 may be formed on the insulation layer 30, for example, by an inkjet technique. That is, the circuit pattern 15 may be formed on the insulation layer 30 by spraying a conductive paste, such as copper or silver, through a nozzle and printing on the insulation layer 30. This may allow adjusting the size of the sprayed particles to implement high-precision micro wiring.

Also, it is apparent that operation s1 may be performed by any of a variety of methods according to design requirements, such as by stacking a copper sheet 10 on the insulation layer 30 and performing exposure and etching to form the circuit pattern 15.

Operation s2 is of forming an insulation substrate 50 by forming interlayer passages which penetrate the insulation layer 30 to join with the insulation layer 30 and electrically connect with the circuit pattern 15. Operation s2 is for forming a means of electrically connecting the circuit patterns 15 of each layer.

The interlayer passages may be formed, for example, by forming through-holes 20b that penetrate the insulation layer 30 and forming plating layers on the wall surfaces of the through-holes 20b. A more detailed description is as follows.

First, the through-holes 20b may be formed by drilling in the insulation layer 30. The drilling may be performed using a CNC drill. A CNC drill refers to a drill that automatically processes the through-holes 20b by means of computer numerical control (CNC) according to drilling data. It is apparent that any of various other means known to the public besides the CNC drill may be used, according to design requirements. Plating may be performed, with conductive material such as copper, on the wall surfaces of the through-holes 20b thus formed, to form plating layers and electrically connect the plating layers with the circuit pattern 15 formed on the surface of the insulation layer 30. As such, the interlayer passages may be formed.

Alternatively, paste bumps 20 may be joined to and hardened on a metal layer, after which the insulation layer 30 may be stacked on the metal layer such that the paste bumps 20 penetrate the insulation layer 30, and then portions of the metal layer may be removed to form the interlayer passages. This method can be readily appreciated by viewing FIG. 1.

Operation s3 is of stacking a heat-release layer 40 on the insulation substrate 50.

As the heat-release layer 40 is stacked on the insulation substrate 50, which is formed by forming the circuit pattern 15 and interlayer passages on the insulation layer 30, the manufacture of the printed circuit board may be completed.

Meanwhile, the insulation substrate 50 described above may be formed in a plurality, where the plurality of insulation substrates 50 may be stacked with the heat-release layers 40 inserted in-between the insulation substrates 50. While the heat-release layers 40 may be inserted between each of the insulation substrates 50, they may also be inserted selectively according to design requirements. As such, a multilayer printed circuit board having heat-release layers 40 interposed in-between may be manufactured.

Furthermore, the interlayer passages may also be formed collectively, after forming only the circuit patterns 15 on the insulation layers 30 and stacking the insulation layers 30 and heat-release layers 40.

As described above, a printed circuit board based on aspects of the invention can provide a high heat-releasing effect and high bending strength, by means of inner layers or ground layers formed by the heat-release layers.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A method of manufacturing a printed circuit board, the method comprising:
   forming a circuit pattern on one side of an insulation layer;
   forming an insulation substrate by penetrating the insulation layer and forming an interlayer passage which electrically connects with the circuit pattern; and
   stacking a heat-release layer on the insulation substrate by stacking a heat-releasing layer on the other side of the insulation layer;
   forming a plurality of insulation substrates by repeating the forming a circuit pattern and the forming an insulation substrate; and
   stacking the plurality of insulation substrates in order,
      wherein the stacking the plurality of insulation substrates in order further comprises additionally interposing heat-release layers in-between the plurality of insulation layers.

2. The method of claim 1, wherein forming the circuit pattern and forming the insulation substrate comprise:
   joining and hardening a paste bump onto a metal layer;
   stacking the insulation layer on the metal layer such that the paste bump penetrates the insulation layer; and
   removing portions of the metal layer to form the circuit pattern and the interlayer passage.

3. The method of claim 1, wherein forming the insulation substrate comprises:
   perforating a through-hole in correspondence with a position of the circuit pattern, the through-hole penetrating the insulation layer; and
   filling the through-hole with conductive paste to form the interlayer passage.

4. The method of claim 1, wherein the heat-released layer is made of material including aluminum.

* * * * *

UNITED STATES PATENT AND TRADEMARK OFFICE
CERTIFICATE OF CORRECTION

PATENT NO.          : 7,810,232 B2  
APPLICATION NO.     : 11/976617  
DATED               : October 12, 2010  
INVENTOR(S)         : Keun-Ho Kim et al.

Page 1 of 1

It is certified that error appears in the above-identified patent and that said Letters Patent is hereby corrected as shown below:

On the Title Page, item [75]: (Inventors), Line 4 delete "Il-Kyoon Jeon" and insert
-- Il-Kyoon Jeon --.

Column 1, Line 9 delete "7,473,099" and insert -- 7,473,099, --, therefor.

Signed and Sealed this
Third Day of May, 2011

David J. Kappos
*Director of the United States Patent and Trademark Office*